US008004016B2

(12) United States Patent
Seong et al.

(10) Patent No.: US 8,004,016 B2

(45) Date of Patent: Aug. 23, 2011

(54) THIN FILM TRANSISTOR SUBSTRATE AND FABRICATING METHOD THEREOF

(75) Inventors: Seok-Je Seong, Yongin-si (KR); Ki-Hun Jeong, Seoul (KR); Jin-Young Choi, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 0 days.

(21) Appl. No.: 12/889,833

(22) Filed: Sep. 24, 2010

(65) Prior Publication Data

US 2011/0012123 A1 Jan. 20, 2011

(30) Foreign Application Priority Data

Dec. 4, 2006 (KR) ........................ 10-2006-0121551

(51) Int. Cl.
*H01L 29/786* (2006.01)
*H01L 21/8234* (2006.01)

(52) U.S. Cl. ......... 257/208; 257/E21.411; 257/E29.275; 438/151

(58) Field of Classification Search .................... 257/59, 257/72, 207, 208, E21.411, E29.275; 438/151; 349/152

See application file for complete search history.

(56) References Cited

U.S. PATENT DOCUMENTS

| | | | | |
|---|---|---|---|---|
| 7,352,426 | B2 * | 4/2008 | Abe et al. | 349/149 |
| 7,545,474 | B2 * | 6/2009 | Yang et al. | 349/152 |
| 2002/0071086 | A1 * | 6/2002 | Kim et al. | 349/152 |
| 2004/0051836 | A1 * | 3/2004 | Jung et al. | 349/149 |

* cited by examiner

*Primary Examiner* — Victor Mandala
*Assistant Examiner* — Scott Stowe
(74) *Attorney, Agent, or Firm* — F. Chau & Associates, LLC

(57) ABSTRACT

A thin film transistor substrate and fabricating method thereof by which the size of the thin film transistor substrate is reduced by constructing data signal supply lines, each of which supplies a pixel data voltage to a data line, with different metal lines, respectively includes gate and data lines crossing each other on a substrate, with a gate insulating layer disposed therebetween, a thin film transistor formed on each intersection between the gate and data lines, a display area on which a pixel electrode connected to the thin film transistor is formed, a first data signal supply line comprising a first conductive layer connected to the data line in a non-display area located at a periphery of the display area, and a second data signal supply line alternating with the first data signal supply line, with the gate insulating layer disposed therebetween, the second data signal supply line comprising a second conductive layer connected to the data line.

8 Claims, 10 Drawing Sheets

THIN FILM TRANSISTOR SUBSTRATE AND FABRICATING METHOD THEREOF

CROSS REFERENCE TO RELATED APPLICATION

The application is a divisional of U.S. application Ser. No. 11/949,863 filed Dec. 4, 2007, which claims priority, under 35 U.S.C. §119, of Korean Patent Application No. 10-2006-0121551, filed on Dec. 4, 2006, the disclosures of which are each incorporated by reference herein in their entireties.

BACKGROUND OF THE INVENTION

1. Technical Field

The present disclosure relates to a thin film transistor substrate and, more particularly, to a thin film transistor substrate having a reduced size obtained by constructing data signal supply lines, each of which supplies a pixel data voltage to a data line, with different metal lines, respectively, and a fabricating method thereof.

2. Discussion of Related Art

Generally, a liquid crystal display ("LCD") device includes an LCD panel displaying an image, a driving circuit driving the LCD panel, and a light source unit supplying light to the LCD panel.

The light source unit includes a light source, such as a lamp or a light emitting diode, to emit light, a light guide plate guiding the light from the light source to the LCD panel, a reflective sheet reflecting and directing the light toward the light guide plate, and optical sheets provided between the light guide plate and the LCD panel to equalize the light luminance from the light guide plate.

The driving circuit includes a gate driving circuit driving a gate line of the LCD panel, a data driving circuit driving a data line, a power unit supplying power to the gate and data driving circuits, and a timing controller supplying control signals to the gate and data driving circuits.

The LCD panel includes a thin film transistor ("TFT") substrate having a TFT array formed thereon, a color filter substrate having a color filter array formed thereon and facing the TFT substrate, and liquid crystals inserted between the TFT substrate and the color filter substrate.

The color filter substrate includes a black matrix on a transparent substrate to prevent light leakage, a color filter in pixel areas partitioned from one another by the black matrix, and a common electrode on the color filter to supply a common voltage.

The TFT substrate includes a pixel electrode on each pixel area and a TFT connected to the pixel electrode. In this case, the gate line supplies a scan signal from the gate driving circuit to a gate electrode of the TFT. The data line supplies a pixel data signal from the data driving circuit to the TFT each time the scan signal is supplied to the gate electrode. Accordingly, the pixel electrode is charged with the pixel data signal.

A separate signal line extending from the data line to be connected to the data driving circuit is additionally formed along a non-display area to supply the pixel data signal from the data driving circuit to the data line. In this case, because the signal line is formed of the same metal as the data line, it is unable to prevent signal interference or a short circuit between the signal lines unless a gap between the neighboring signal lines is maintained to exceed at least 4 μm.

When the gap between the neighboring signal lines is maintained to be about 4 μm, however, the size of the non-display area increases in proportion to the number of the data lines. Hence, the size of the TFT substrate increases.

SUMMARY OF THE INVENTION

An exemplary embodiment of the present invention provides a TFT substrate and fabricating method thereof, whereby the size of the TFT substrate is reduced by constructing data signal supply lines with first and second conductive layers and forming a bridge electrode connecting a data line to the corresponding data signal supply line.

An exemplary embodiment of the present invention provides the TFT and fabricating method thereof, whereby a resistance ratio between a data line and a data signal supply line connected to the data line is equalized by differentiating a contact resistance in a manner of varying the sizes of contact holes connected to a bridge electrode in connecting the data signal supply line to a data line.

An exemplary embodiment of the present invention provides the TFT substrate including gate and data lines crossing each other on a substrate, with a gate insulating layer disposed therebetween, a TFT on each intersection between the gate and data lines, a display area in which a pixel electrode connected to the TFT is formed, a first data signal supply line including a first conductive layer connected to the data line in a non-display area located at a periphery of the display area, and a second data signal supply line alternating with the first data signal supply line, with the gate insulating layer disposed therebetween, the second data signal supply line including a second conductive layer connected to the data line.

The first data signal supply line may be formed of the same metal material and on the same plane as the gate line. The second data signal supply line may also be formed of the same metal material and on the same plane as the data line.

The second data signal supply line may be formed to be parallel with one side of the first data signal supply line.

The first data signal supply line may be connected to an $M^{th}$ data line, and the second data signal supply line may be connected to an $(M+1)^{th}$ data line (where M is a natural number).

The TFT substrate may further include first and second contact holes exposing the first data signal supply line and the $M^{th}$ data line, respectively, a first bridge electrode connecting the first data signal supply line and the $M^{th}$ data line via the first and second contact holes, third and fourth contact holes exposing the second data signal supply line and the $M^{th}$ data line, respectively, and a second bridge electrode connecting the first data signal supply line and the $(M+1)^{th}$ data line via the third and fourth contact holes.

The first and second contact holes may be larger than the third and fourth contact holes, or vice versa.

The first and second bridge electrodes may be formed of the same metal and on the same plane as the pixel electrode.

The first and second data signal supply lines may be formed in the non-display areas located above and below the display area, respectively.

The first and second data signal supply lines formed in the non-display area located above the display area are connected to $M^{th}$ and $(4M-2)^{th}$ data lines, respectively, and the first and second data signal supply lines formed in the non-display area located below the display area are connected to $(4M-3)^{th}$ and $(4M-1)^{th}$ data lines, respectively.

The TFT substrate may further include first and second contact holes exposing the first data signal supply line and the $4M^{th}$ data line on the non-display areas placed above and below the display area, respectively, a first bridge electrode connecting the first data signal supply line and the $4M^{th}$ data line via the first and second contact holes, third and fourth contact holes exposing the second data signal supply line and the $(4M-2)^{th}$ data line on the non-display areas located above and below the display area, respectively, and a second bridge electrode connecting the second data signal supply line and the $(4M-2)^{th}$ data line via the third and fourth contact holes.

The first and second contact holes may be larger than the third and fourth contact holes, or vice versa.

The first and second bridge electrodes may be formed of the same metal and on the same plane as the pixel electrode.

A specific resistance of the first data signal supply line may be smaller than a specific resistance of the second data signal supply line.

A contact pad connected to a driving circuit may be formed at each of the ends of the first and second data signal supply lines.

An exemplary embodiment of the present invention provides a method of fabricating a TFT substrate that includes forming gate and data lines crossing each other on a substrate, with a gate insulating layer disposed therebetween, and the gate and data lines defining a display area, forming a TFT on each intersection between the gate and data lines, forming a pixel electrode connected to the TFT on the display area, forming a first data signal supply line to connected to the data line in a non-display area located at a periphery of the display area, and forming a second data signal supply line connected to the data line to alternate with the first data signal supply line, with the gate insulating layer disposed therebetween.

The first data signal supply line may be formed as a first conductive layer identical with the gate line and the second data signal supply line is formed as a second conductive layer identical with the data line.

In forming the second data signal supply line, the second data signal supply line may be formed parallel with one side of the first data signal supply line.

The method may further include forming a first contact hole exposing the first data signal supply line, forming a second contact hole exposing one end of the data line connected to the first data signal supply line, forming a first bridge electrode connecting the first data signal supply line and the data line via the first and second contact holes, forming a third contact hole exposing the second data signal supply line, forming a fourth contact hole exposing one end of the data line connected to the second data signal supply line, and forming a second bridge electrode connecting the second data signal supply line and the data line via the third and fourth contact holes.

In forming the first to fourth contact holes, the first and second contact holes may be larger than the third and fourth contact holes, and vice versa.

A specific resistance of a first conductive layer constructing the first data signal line may be smaller than a specific resistance of a second conductive layer constructing the second data signal supply line, and the first and second contact holes may be smaller than the third and fourth contact holes.

In forming the pixel electrode, the first and second bridge electrodes may be formed of the same metal as the pixel electrode.

The first and second data signal supply lines may be formed in the non-display areas located above and below the display area, respectively.

The method may further include connecting the first data signal supply line on the non-display area located above the display area to the $4M^{th}$ data line via the first bridge electrode, connecting the first data signal supply line on the non-display area located below the display area to the $(4M-3)^{th}$ data line via the first bridge electrode, connecting the second data signal supply line on the non-display area located above the display area to the $(4M-2)^{th}$ data line via the second bridge electrode, and connecting the second data signal supply line on the non-display area located below the display area to the $(4M-1)^{th}$ data line via the second bridge electrode;

In forming the first and second data signal supply lines, a contact pad connected to a driving circuit may be formed at each of the ends of the first and second data signal supply lines.

Exemplary embodiments of the present invention are described in greater detail below with reference to the accompanying drawings. The same reference numbers will be used throughout the drawings to refer to the same or like parts. Detailed descriptions of well-known functions and structures incorporated herein are omitted to avoid obscuring the subject matter of the present invention.

While the present invention is susceptible of embodiment in many different forms, the exemplary embodiments are shown in drawings with the understanding that the present disclosure is to be considered as an exemplification of the principles of the invention and is not intended to limit the invention to the exemplary embodiments illustrated.

BRIEF DESCRIPTION OF THE DRAWINGS

Exemplary embodiments of the present invention will be understood in more detail from the following descriptions taken in conjunction with the accompanying drawings, wherein.

DETAILED DESCRIPTION OF EXEMPLARY EMBODIMENTS

Figure 1:
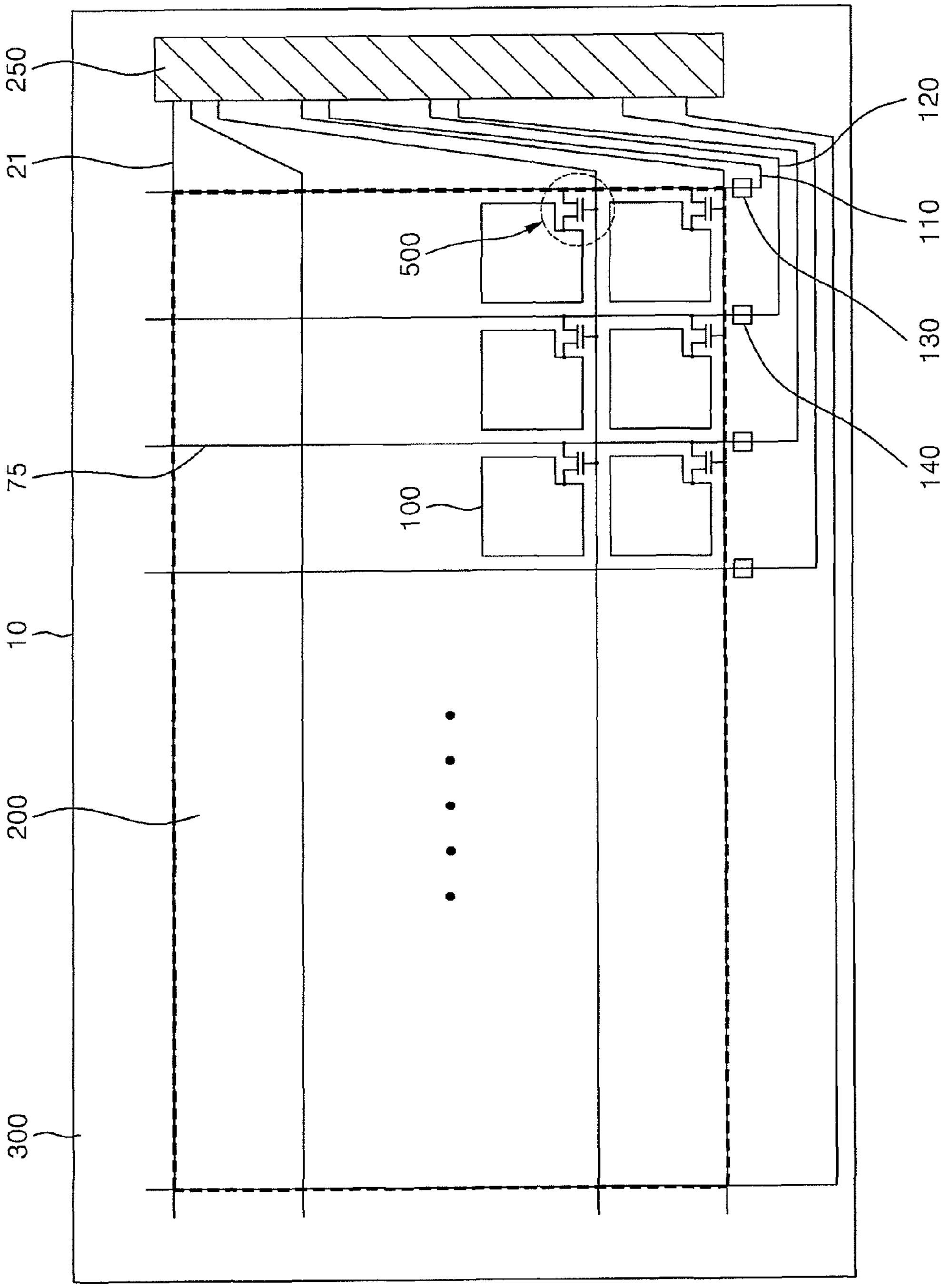
FIG. 1 is a plan view of a TFT substrate according to an exemplary embodiment of the present invention.
Figure 2:
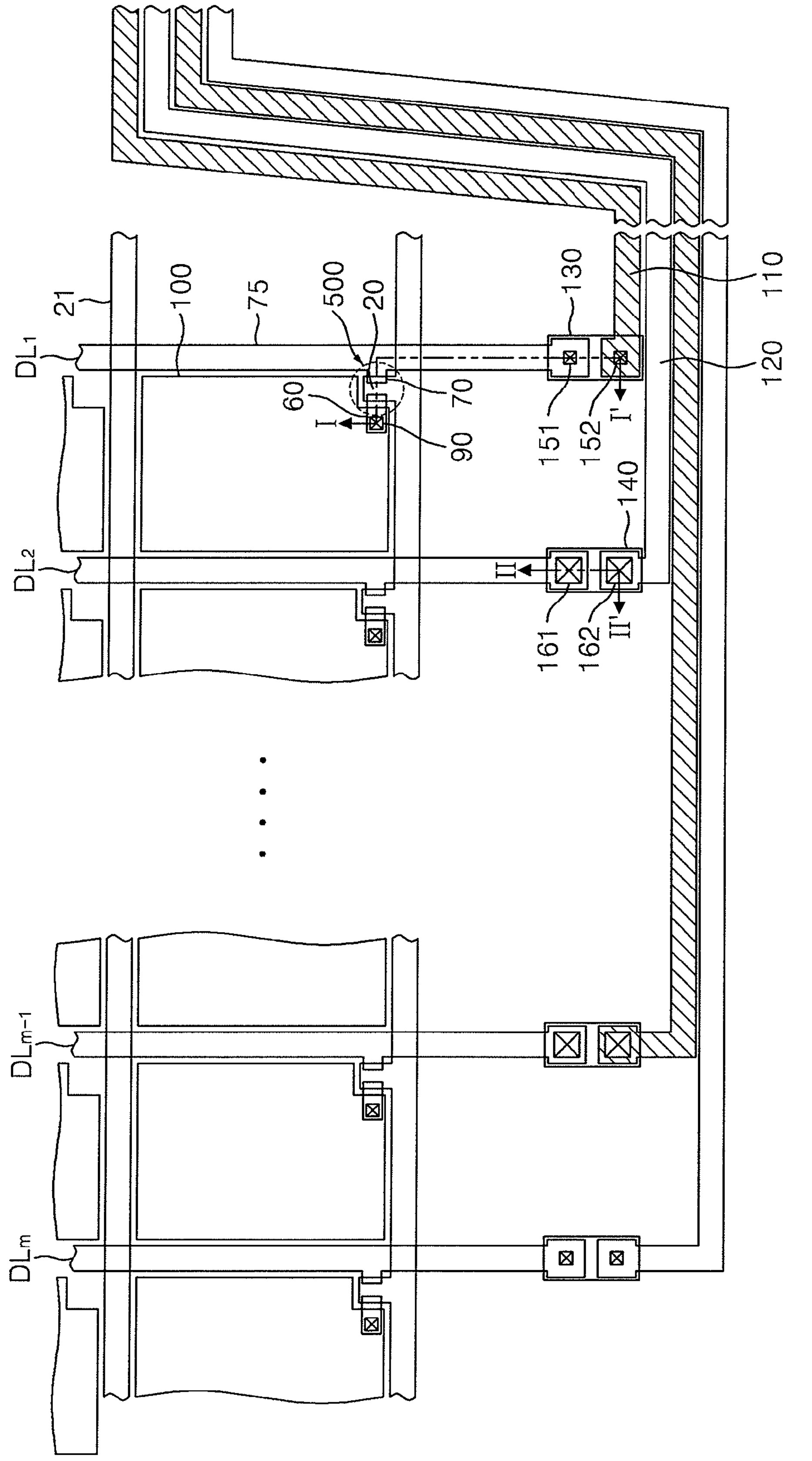
FIG. 2 is an enlarged view of the TFT substrate shown in FIG. 1.
Figure 3A:
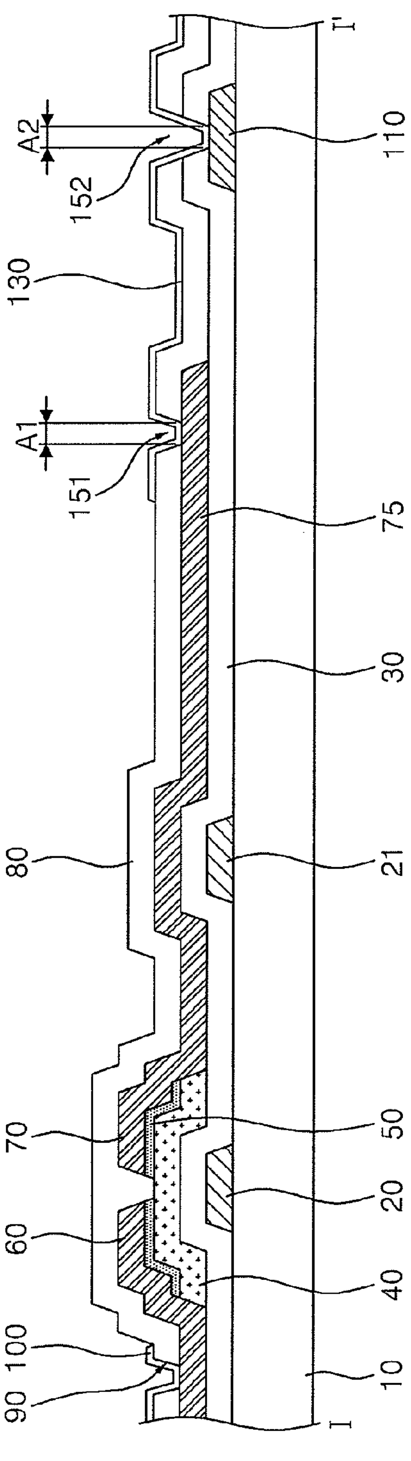
FIGS. 3A and 3B are cross-sectional views of the TFT substrate taken along lines I-I' and II-II' in FIG. 2.
Figure 3B:
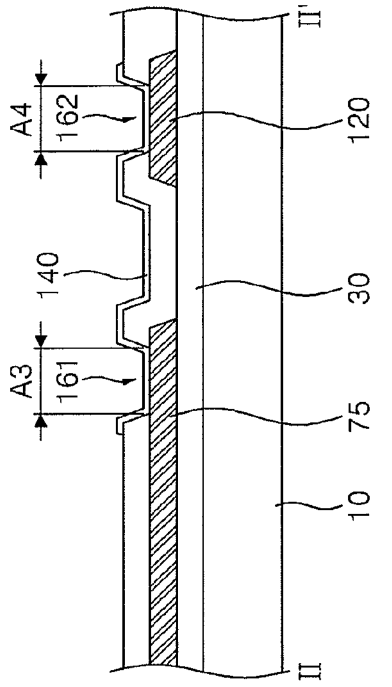

FIG. 1 is a plan view of a TFT substrate according to an exemplary embodiment of the present invention, FIG. 2 is an enlarged view of the TFT substrate shown in FIG. 1, and FIGS. 3A and 3B are cross-sectional views of the TFT substrate taken along lines I-I' and II-II' in FIG. 2.

The TFT substrate according to an exemplary embodiment of the present invention includes gate and data lines 21 and 75 crossing each other on a substrate 10, with a gate insulating layer, shown at 30 in FIGS. 3A and 3B, therebetween; a TFT 500 formed at each intersection between the gate and data lines 21 and 75; a display area 200 provided with a pixel electrode 100 connected to the TFT 500; a contact pad 250 on a non-display area 300 located at a periphery of the display area 200 to be connected to a driving circuit; first and second data signal supply lines 110 and 120 in the non-display area 300 to be connected to one side of the contact pad 250 and including first and second conductive layers (not shown), respectively; and first and second bridge electrodes 130 and 140 connecting the first and second data signal supply lines 110 and 120 with the data line 75 via first, second, third, and fourth contact holes 151, 152, 161 and 162, respectively. The first and second contact holes 151 and 152 differ in size from the third and fourth contact holes 161 and 162.

In particular, the substrate 10 is formed of a transparent insulating material such as glass or plastic. The TFT 500 is formed on the substrate 10 in each intersection between the gate and data lines 21 and 75.

The TFT 500 is turned on by a gate-on voltage supplied from the gate line 21 to supply a pixel data voltage from the data line 75 to the pixel electrode 100. As shown in FIG. 3A, the TFT 500 includes a gate electrode 20, the gate insulating layer 30 on the gate electrode 20, a semiconductor layer 40 on the gate insulating layer 30, an ohmic contact layer 50 on the semiconductor layer 40, and source and drain electrodes 70 and 60 on the ohmic contact layer 50 arranged to oppose each other.

As shown in FIG. 2, the gate electrode 20 protrudes from the gate line 21 and, thus, is electrically connected to the gate line 21. The gate electrode 20 is formed of the same metal as the gate line 21 and on the same plane thereof.

The gate insulating layer 30 shown in FIG. 3A is formed of an inorganic insulating layer such as SiNx or SiOx, and formed over the entire surface of the substrate 10 on which the gate line 21 and the gate electrode 20 are formed. The gate insulating layer 30 prevents the gate line 21 and the gate electrode 20 from being directly connected to another signal line or signal electrode.

The semiconductor layer 40 overlaps the gate electrode 20 with the gate insulating layer 30 disposed therebetween. The semiconductor layer 40 is formed of amorphous silicon ($\alpha$-Si) and forms a channel of the TFT 500.

The ohmic contact layer 50 is provided between the semiconductor layer 40 and the source and drain electrodes 70 and 60 for forming ohmic contacts. The ohmic contact layer 50 is formed of impurity-doped amorphous silicon (M+ $\alpha$-Si).

The source electrode 70 overlaps the semiconductor layer 40 with the ohmic contact layer 50 disposed therebetween. When the source electrode 70 is electrically connected to the data line 75 to turn on the TFT 500, the pixel data voltage supplied from the data line 75 is supplied to the drain electrode 60. The source electrode 70 is formed of the same metal as the data line 75 and is formed on the same plane.

The drain electrode 60 overlaps the semiconductor layer 40 with the ohmic contact layer 50 disposed therebetween and opposes the source electrode 70. The drain electrode 60 is formed of the same metal as the data line 75 and the source electrode 70 and is formed on the same plane.

The gate line 21 includes a single, double or multi-layer formed of an opaque metal on the substrate 10. In this exemplary embodiment, the opaque metal includes a single metal such as Al, Cu, Ag, Mo, Cr, W, or an alloy thereof. The gate line 21 may include a double layer formed of AlNd and Mo. The double-layered gate line 21 includes a lower layer of AlNd and an upper layer of Mo. The gate line 21 supplies a gate-on or gate-off voltage from the gate driving circuit to the gate electrode 20 of the TFT 500.

The data line 75 includes a single, double or multi-layer formed of an opaque metal on the gate insulating layer 30. In this exemplary embodiment, the opaque metal includes a single metal such as Al, Cu, Ag, Mo, Cr, W, or an alloy thereof. The data line 75 supplies a pixel data signal from the data driving circuit (not shown) to the TFT 500 each time the gate-on voltage is supplied to the gate line 21.

In order to supply the pixel data signal to the data line 75, the data signal supply lines 110 and 120 connected to the contact pad 250 contacting with the driving circuit are formed on the non-display area 300 of the substrate 10.

The data signal supply lines 110 and 120 include a first data signal supply line 110 formed of the first conductive layer and a second data signal supply line 120 formed of the second conductive layer.

The first data signal supply line 110 is formed of the first conductive layer constructed as a single, double or multi-layer line. In this exemplary embodiment, the first conductive layer may include a single metal such as Al, Cu, Ag, Mo, Cr, W, or an alloy thereof. More specifically, the conductive layer is selected in consideration of a process for forming the lines, the internal resistance of the metal, and the like. Accordingly, the first signal supply line 110 includes a single layer of Al, or a double layer of AlNd alloy and Mo, like the gate line 21. The AlNd alloy having a good characteristic of adhesiveness to the substrate 10 and a small specific resistance forms a lower layer, while the Mo having a good characteristic of contact with a transparent conductive layer of ITO (indium tin oxide), IZO (indium zinc oxide) ITZO (indium tin zinc oxide), and the like, forms an upper layer. The first data signal supply line 110 is formed to be about 4 μm wide. One side of the data signal supply line 110 is electrically connected to the data line 75, whereas the other side of the data signal supply line 110 is connected to the driving circuit (not shown) via the contact pad 250 to supply the pixel data signal from the driving circuit to the data line 75. The contact pad 250 penetrates the gate insulating layer 30 and a passivation layer 80 overlapping first ends of the first and second data signal supply lines 110 and 120 to partly expose the first and second data signal supply lines 110 and 120 and to be connected to the outside via a transparent conductive layer contacting with the exposed metal layer.

The second data signal supply line 120 is formed of the second conductive layer different from the first data signal supply line 110. The second data signal supply line 120 is formed parallel with the first signal supply line 110 on the gate insulating layer 30. In other words, the second data signal supply line 120 runs parallel with the first data signal supply line 110, with the gate insulating layer 30 disposed therebetween. The second data signal supply line 120 includes a signal layer of Mo or Cr chosen in consideration of a contact characteristic with the transparent conductive layer such as ITO, IZO, ITZO, and the like. The second data signal supply line 120 is formed to be about 4 μm wide. One side of the second data signal supply line 120 is electrically connected to the data line 75, whereas the other side is connected to the driving circuit via the contact pad 250 to supply a pixel data signal from the driving circuit (not shown) to the data line 75.

The first data signal supply line 110 and the second data signal supply line 120 are formed so as to alternate with each other. More specifically, as shown in FIG. 2, the first data signal supply line 110 is connected to an $M^{th}$ data line DLm and the second data signal supply line 120 is connected to an $(M+1)^{th}$ data line DLm+1. Accordingly, by reducing a gap between the first and second data signal supply lines 110 and 120, it is possible to reduce the size of an LCD panel yet still provide the same resolution. For example, when each width of the first and second data signal supply lines 110 and 120 is 4 μm and when the number of the data lines 75 is 960, the total width of the first and second data signal supply lines 110 and 120 is 3,840 μm. Accordingly, the area using two different metal layers is reduced to a half of the area using a single metal layer, so that the area of the non-display area 300 occupied by the data signal supply line can be decreased, thereby reducing the size of the TFT substrate.

The first and second data signal supply lines 110 and 120 are electrically connected to the data line 75 via the bridge electrodes 130 and 140, respectively. The bridge electrodes 130 and 140 include a first bridge electrode 130 connecting the first data signal supply line 110 and the data line 75 and a second bridge electrode 140 connecting together the second data signal supply line 120 and the data line 75.

The first bridge electrode 130 electrically connects the first data signal supply line 110 and the $M^{th}$ data line DLm via the first contact hole 151 shown in FIG. 2 penetrating both the gate insulating layer 30 and the passivation layer 80 and the second contact hole 152 penetrating the passivation layer 80.

The second bridge electrode 140 electrically connects the second data signal supply line 120 and the $(M+1)^{th}$ data line via the third and fourth contact holes 161 and 162 penetrating the passivation layer 80. In this exemplary embodiment, the first and second bridge electrodes 130 and 140 are formed of the same material and on the same plane.

The first contact hole 151 penetrates the gate insulating layer 30 and the passivation layer 80 to expose the first conductive layer, that is, the first data signal supply line 110, while the second contact hole 152 penetrates the passivation layer 80 on the $M^{th}$ data line DLm connected to the first data signal supply line 110 to expose the $M^{th}$ data line DLm. The third contact hole 161 penetrates the passivation layer 80 to expose the second data signal supply line 120. The fourth contact hole 162 penetrates the passivation layer 80 overlapping the $(M+1)^{th}$ data line DLm+1 connected to the second data signal supply line 120 to expose the $(M+1)^{th}$ data line DLm+1. In this exemplary embodiment, because the specific resistance of the first data signal supply line 110 is relatively smaller than that of the second data signal supply line 120, the sizes A3 and A4 shown in FIG. 3B of the third and fourth contact holes 161 and 162 are configured larger than the sizes A1 and A2 shown in FIG. 3A of the first and second contact holes 151 and 152, respectively. More specifically, the sizes A1 and A2 of the first and second contact holes 151 and 152 connected to the first bridge electrode 130 connecting the first data signal supply line 110 and the $M^{th}$ data line DLm are formed to be relatively small. Accordingly, a contact area between the first data signal supply line 110 and the first bridge electrode 130 connected via the first contact hole 151 is reduced, and a contact area between the $M^{th}$ data line DLm and the first bridge electrode 130 connected via the second contact hole 152 is reduced, whereby a contact resistance is increased.

The sizes of the third and fourth contact holes 161 and 162 contacting the second bridge electrode 140 connecting the second data signal supply line 120 and the $(M+1)^{th}$ data line DLm+1 are increased. Accordingly, a contact area between the second data signal supply line 120, and the second bridge electrode 140 connected via the third contact hole 161 is increased, and a contact area between the $(M+1)^{th}$ data line DLm+1 and the second bridge electrode 140 connected via the fourth contact hole 162 is increased, whereby a contact resistance is reduced.

Accordingly, the pixel data signals supplied from the first and second data signal supply lines 110 and 120 undergo a variance in contact resistances depending on the areas of the first, second, third, and fourth contact holes 151, 152, 161 and 162, whereby the voltage supplied to the Mth data line DLm differs as a voltage drop from the voltage supplied to the $(M+1)^{th}$ data line DLm+1.

Figure 4:
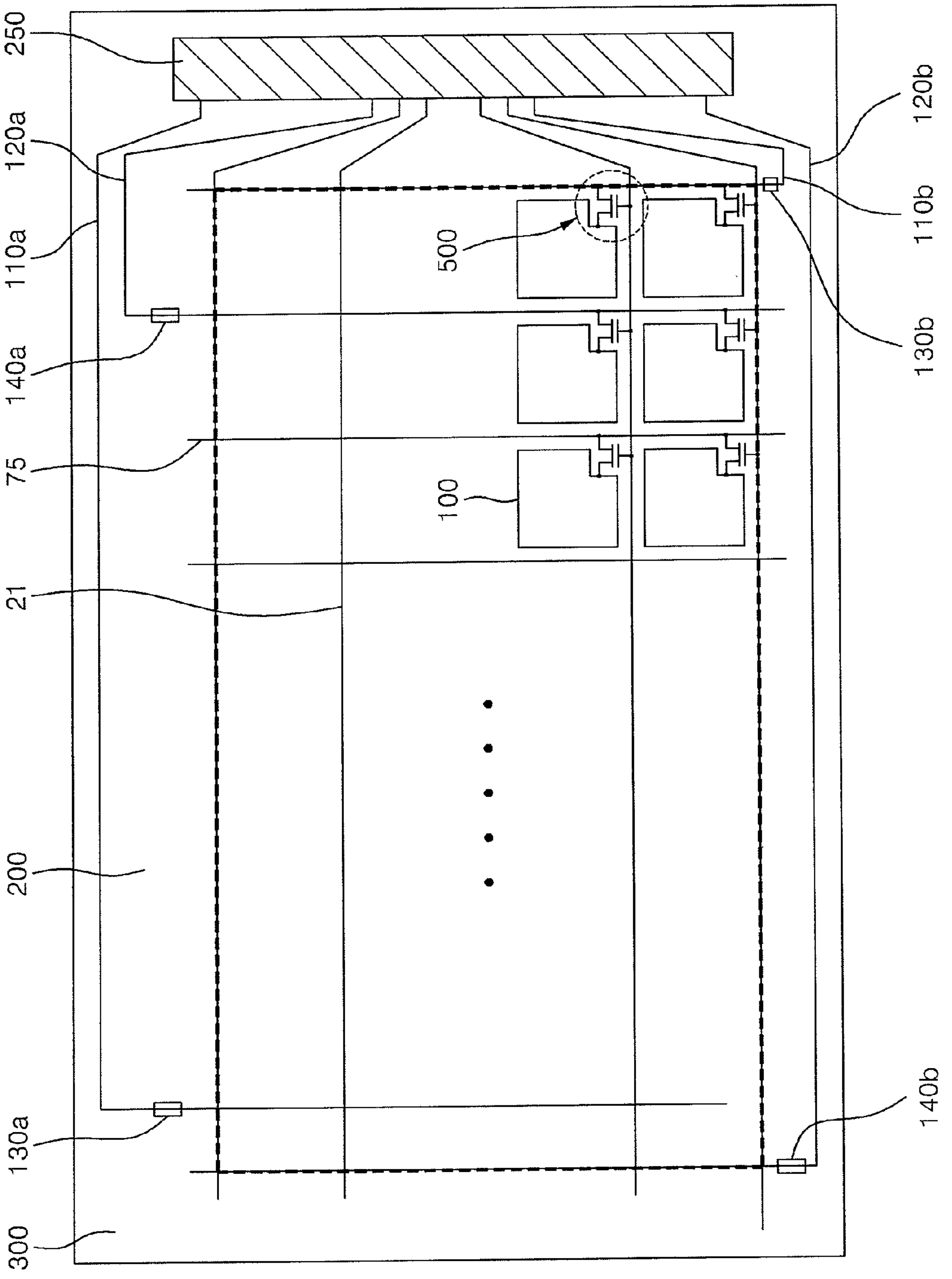
FIG. 4 is a plan view of a TFT substrate according to an exemplary embodiment of the present invention.

As shown in FIG. 4, the first and second data signal supply lines 110 and 120 may be formed in the non-display area 300 located above and below the display area 200, respectively.

Figure 5:
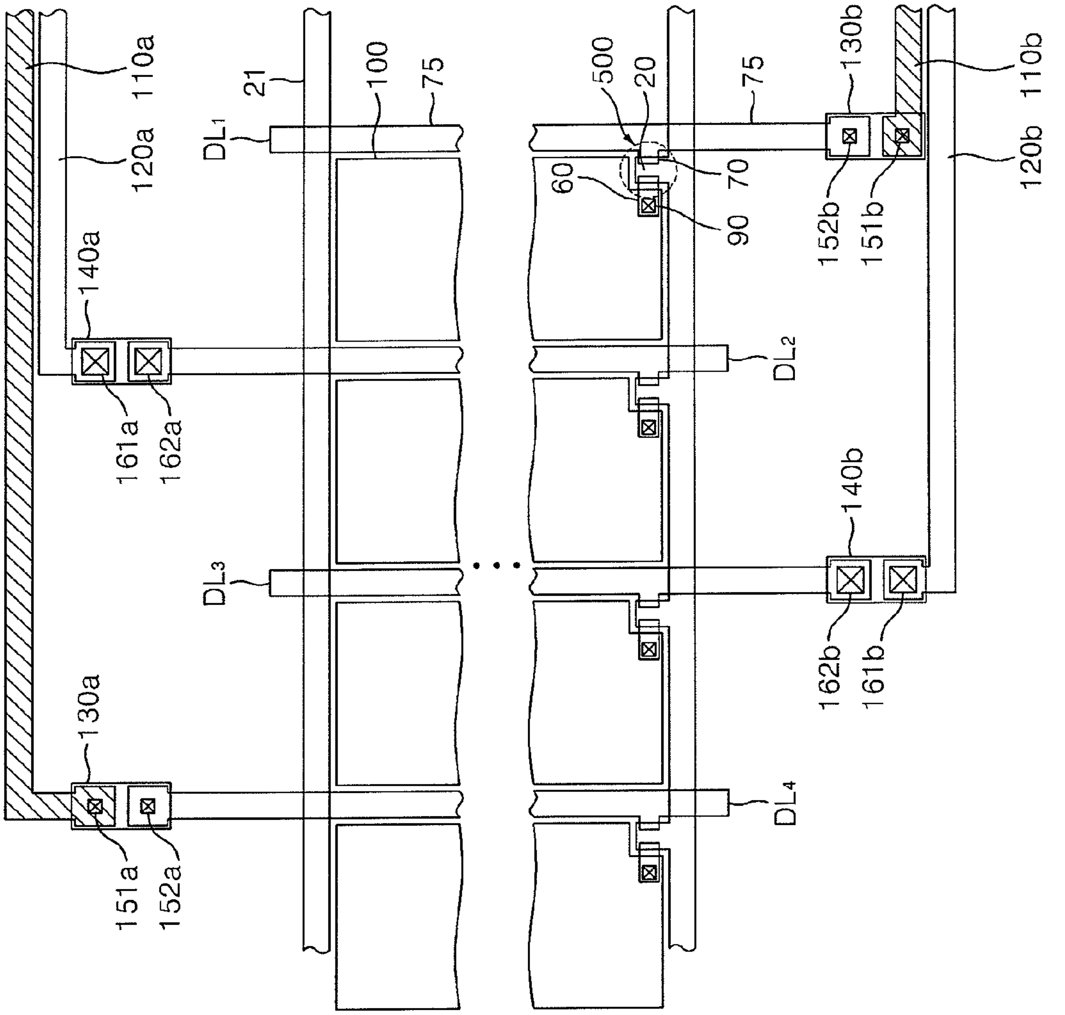
FIG. 5 is a plan view of the TFT substrate shown in FIG. 4, in which data signal supply lines on upper and lower sides of a display area are shown.

FIG. 4 is a plan view of a TFT substrate according to an exemplary embodiment of the present invention, and FIG. 5 is a plan view of the TFT substrate shown in FIG. 4, in which the data signal supply lines on the upper and lower sides of a display area are shown.

Referring to FIG. 4 and FIG. 5, one half of the first and second data signal supply lines 110 and 120 is formed in the non-display area 300 located above the display area 200, while the other half of the first and second data signal supply lines 110 and 120 is formed in the non-display area 300 located below the display area 200. In this exemplary embodiment, the first and second data signal supply lines 110 and 120 formed in the non-display area 300 located above the display area 200 are alternately provided Similarly, the first and second data signal supply lines 110 and 120 formed in the non-display area 300 located below the display area 200 are alternately provided. In this manner, the area of the non-display area 300 having the first and second data signal supply lines 110 and 120 is reduced, whereby the size of the TFT substrate may be reduced. In this exemplary embodiment, a first upper data signal supply line 110*a* formed in the non-display area 300 located above the display area 200 is formed of the first conductive layer and is connected to a first upper bridge electrode 130*a* to enable a pixel data signal to be supplied to a $4M^{th}$ data line DL4. A second upper data signal supply line 120*a* formed in the non-display area 300 located above the display area 200 is formed of the second conductive layer and is connected to a second upper bridge electrode 140*a* to enable a pixel data signal to be supplied to a $(4M-2)^{th}$ data line DL2. In this exemplary embodiment, a first upper contact hole 151*a* is formed to expose the first upper data signal supply line 110*a*, while a second upper contact hole 152*a* is formed to expose the $4M^{th}$ data line DL4. Accordingly, the first upper bridge electrode 130*a* electrically connects the first upper data signal supply line 110*a* and the $4M^{th}$ data line DL4 via the first and second upper contact holes 151*a* and 152*a*. A third upper contact hole 161*a* is formed to expose the second upper data signal supply line 120*a*, while a fourth upper contact hole 162*a* is formed to expose the $(4M-2)^{th}$ data line DL2. Accordingly, the second upper bridge electrode 140*a* electrically connects the second upper data signal supply line 120*a* and the $(4M-2)^{th}$ data line via the third and fourth upper contact holes 161*a* and 162*a*.

A first lower data signal supply line 110*b* formed in the non-display area 300 located below the display area 200 is formed of the first conductive layer and is connected to a first lower bridge electrode 130*b* to enable a pixel data signal to be supplied to a $(4M-3)^{th}$ data line DL1. A second lower data signal supply line 120*b* formed in the non display area 300 located below the display area 200 is formed of the second conductive layer and is connected to a second lower bridge electrode 140*b* to enable a pixel data signal to be supplied to a $(4M-1)^{th}$ data line DL3. In this exemplary embodiment, a first lower contact hole 151*b* is formed to expose the first lower data signal supply line 110*b*, while a second lower contact hole 152*b* is formed to expose the $(4M-3)^{th}$ data line DL1. Accordingly, the first lower bridge electrode 130*b* electrically connects the first lower data signal supply line 110*b* and the $(4M-3)^{th}$ data line DL1 via the first and second lower contact holes 151*b* and 152*b*. A third lower contact hole 161*b* is formed to expose the second lower data signal supply line 120*b*, while a fourth lower contact hole 162*b* is formed to expose the $(4M-1)^{th}$ data line DL3. Accordingly, the second lower bridge electrode 140*b* electrically connects the second lower data signal supply line 120*b* and the $(4M-1)^{th}$ data line DL3 via the third and fourth lower contact holes 161*b* and 162*b*.

In this exemplary embodiment, the sizes of the first and second contact holes 151*a*, 151*b*, 152*a* and 152*b* are formed to be smaller than the sizes of the third and fourth contact holes 161*a*, 161*b*, 162*a* and 162*b*. Accordingly, voltages supplied to the data line 75 via the first and second data signal supply lines 110 and 120 differ in voltage drop from each other.

The first and second data signal supply lines 110 and 120 are assigned to the display area 200 divided into two parts, so that the data lines 75 corresponding to one part of the display area 200 receive the pixel data signal via the first and second data signal supply lines 110 and 120 formed in the non-display area 300 above the display area 200, and the data lines 75 corresponding to the other part of the display area 200 receive the pixel data signal via the first and second data signal supply lines 110 and 120 formed in the non-display area 300 located below the display area 200. In an exemplary embodiment, the first and second data signal supply lines 110 and 120 are alternately configured.

FIGS. 6A, 6B, 7A, 7B, 8A, 8B, 9A, 9B, 10A and 10B are cross-sectional views showing a method of fabricating the TFT substrate according to an exemplary embodiment of the present invention. For example, the method of fabricating the TFT substrate according to an exemplary embodiment of the present invention may be carried out using four masks.

Figure 6A:
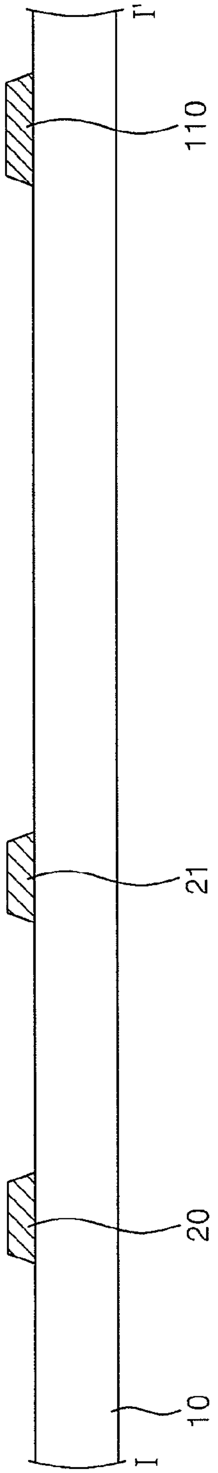
FIGS. 6A, 6B, 7A, 7B, 8A, 8B, 9A, 9B, 10A and 10B are cross-sectional views showing a method of fabricating the TFT substrate according to an exemplary embodiment of the present invention.
Figure 6B:
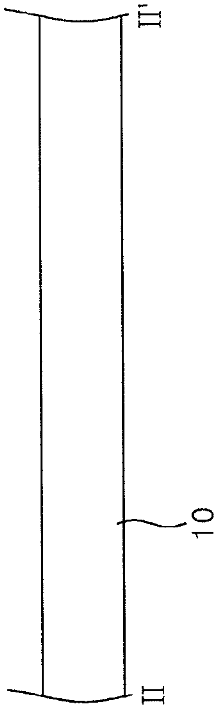

FIGS. 6A and 6B are cross-sectional views showing a first mask process of the method of fabricating the TFT substrate according to an exemplary embodiment of the present invention.

A first conductive pattern group including the gate line 21, the gate electrode 20, and the first data signal supply line 110 is formed on the substrate 10 by the first mask process.

More specifically, the first conductive layer is deposited on the substrate 10 by a deposition method, such as sputtering. The first conductive layer may be formed as a single layer including metal such as Al, Cr, Cu, Mo, W, or an alloy thereof, or formed as a multi-layer structure formed of a combination of these metals. In this exemplary embodiment, the first conductive layer is formed as a double layer structure by considering an adhesion characteristic between AlNd/Mo and the substrate 10 and a characteristic of a small specific resistance. Specifically, AlNd is first formed on the entire surface of the substrate 10 by a deposition method, such as sputtering. Then, Mo is deposited on the AlNd by the same method. Subsequently, the first conductive layer is patterned by photolithography using a first mask and an etching process to form the first conductive pattern group including the gate line 21, the gate electrode 20, and the first data signal supply line 110. In this exemplary embodiment, the first data signal supply line 110 is formed on the non-display area 300 of FIG. 4, while the gate line 21 and the gate electrode 20 are formed on the display area 200. A storage electrode forming a storage capacitor and a storage line supplying a storage voltage to the storage electrode may be further formed.

The first data signal supply line 110 may be divided so as to be formed on the non-display areas 300 located above and below the display area 200.

Figure 7A:
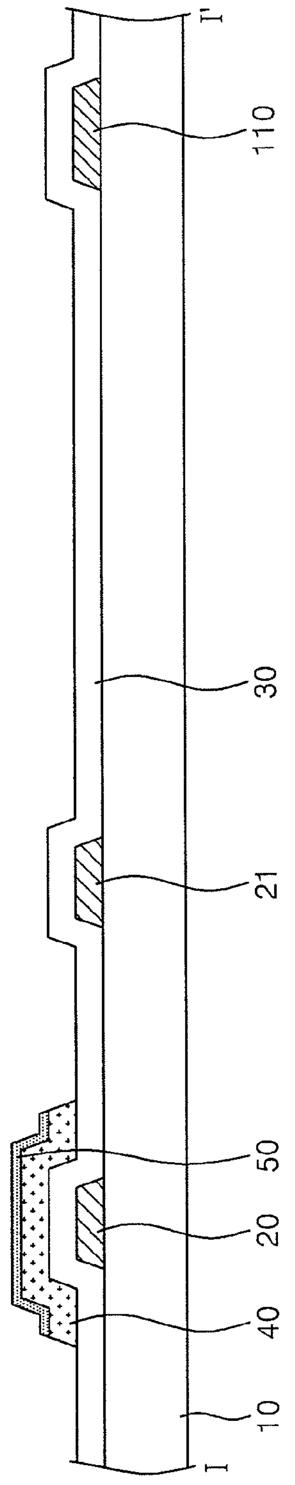
Figure 7B:
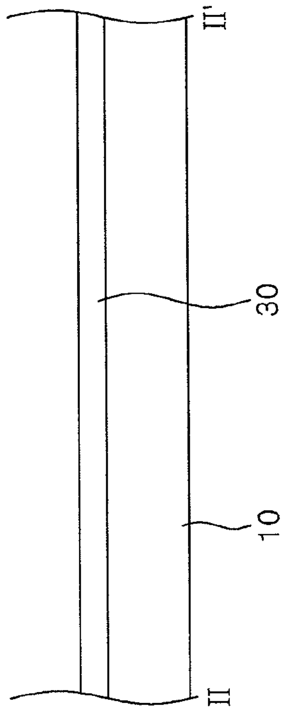

FIGS. 7A and 7B are cross-sectional views showing a second mask process of the method according to an exemplary embodiment of the present invention.

The gate insulating layer 30, the semiconductor layer 40 and the ohmic contact layer 50 are formed by the second mask process over the substrate 10 having the first conductive pattern group formed thereon.

More specifically, the gate insulating layer 30, an amorphous silicon layer, and an impurity-doped amorphous silicon layer are sequentially stacked by deposition, such as plasma enhanced chemical vapor deposition (PECVD) or chemical vapor deposition, on the substrate 10 on which the gate line 21, the gate electrode 20, and the first data signal supply line 110 have been formed. Subsequently, the amorphous silicon layer and the impurity-doped amorphous silicon layer are patterned by photolithography using a second mask and an etching process to form the semiconductor layer 40 and the ohmic contact layer 50. In this exemplary embodiment, the gate insulating layer 30 is formed of an inorganic insulating material, such as silicon nitride ($SiN_x$) or silicon oxide ($SiO_x$).

Figure 8A:
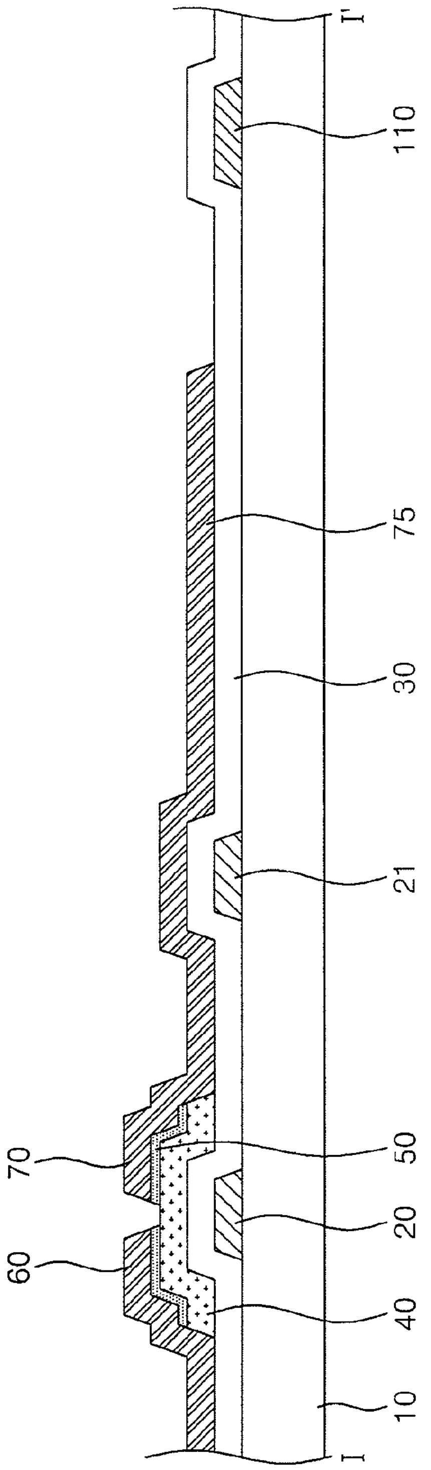
Figure 8B:
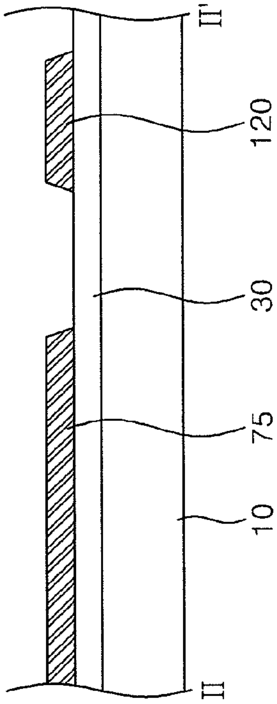

FIGS. 8A and 8B are cross-sectional views showing a third mask process of the method according to an exemplary embodiment of the present invention.

A second conductive pattern group including the data line 75, the source electrode 70, the drain electrode 60, and the second data signal supply line 120 is formed by the third mask process on the gate insulating layer 30 on which the semiconductor layer 40 and the ohmic contact layer 50 have been formed.

More specifically, the data line 75 is formed on the gate insulating layer 30 so as to cross the gate line 21. The drain electrode 60 is formed on the gate insulating layer 30 on which the semiconductor layer 40 and the ohmic contact layer 50 have been formed. The source electrode 70 protrudes from the data line 75 to be formed on the gate insulating layer 30 on which the semiconductor layer 40 and the ohmic contact layer 50 have been formed and to oppose the drain electrode 60. The second data signal supply line 120 is formed parallel with the first data signal supply line 110. Alternatively, the second data signal supply line 120 runs along one side of the first data signal supply line 110. In this exemplary embodiment, the second data supply line 120 may be formed on the non-display areas 300 located above and below the display area 200. Thus, the second conductive pattern group is provided by forming the second conductive layer by a deposition method, such as sputtering, and then patterning the second conductive layer by photolithography using the third mask process and an etching process. In this exemplary embodiment, the second conductive layer may be formed as a single layer of metal, such as Al, Cr, Cu, Mo, W, and the like or an alloy thereof or as a multi-layer structure of a combination thereof. In an exemplary embodiment of the present invention, the second conductive pattern group is formed as a single layer of Mo.

Figure 9A:
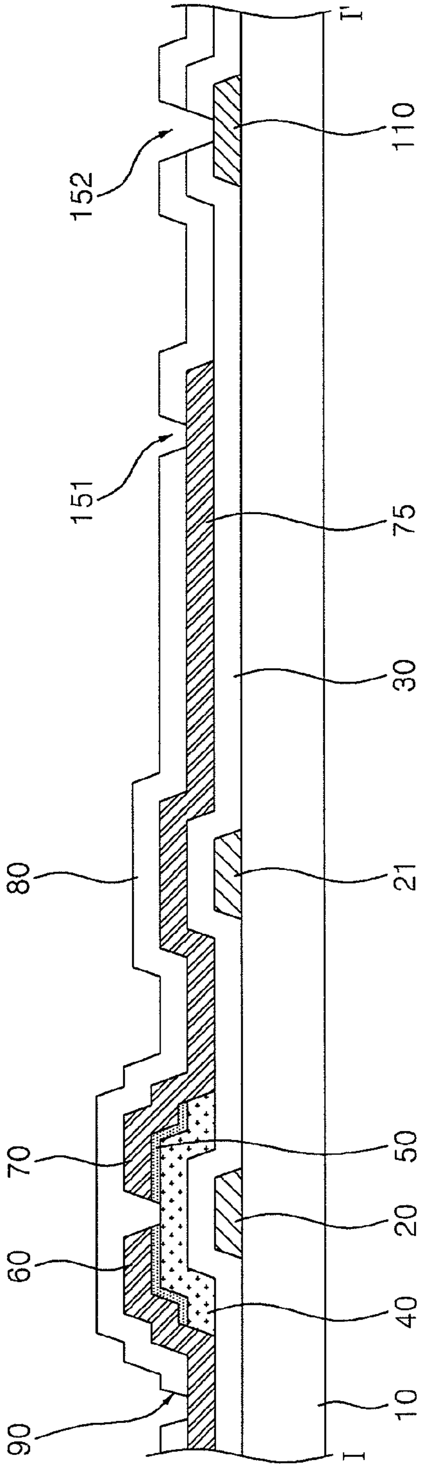
Figure 9B:
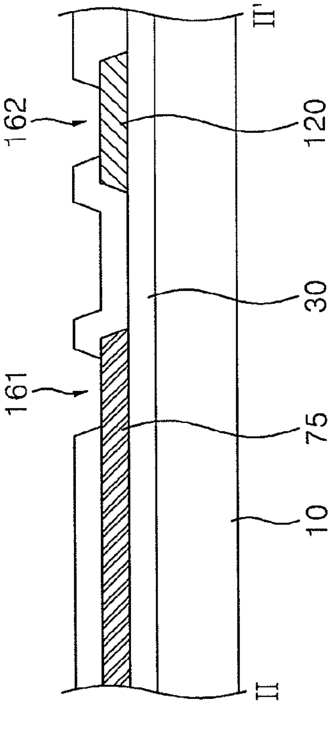

FIGS. 9A and 9B are cross-sectional views showing a fourth mask process of the method according to an exemplary embodiment of the present invention.

The passivation layer 80 having the pixel contact hole 90 and the first, second, third, and fourth contact holes 151, 152, 161, and 162 is formed by the fourth mask process on the gate insulating layer 30 provided with the second conductive pattern group thereon.

More specifically, the passivation layer 80 is formed by a deposition method, such as PECVD, CVD, or spin coating, over the substrate 10 on which the second conductive pattern group has been formed. By photolithography using a fourth mask and an etching process, the pixel contact hole 90 exposing the drain electrode 60, the first contact hole 151 exposing the first data signal supply line 110, the second contact hole 152 exposing the data line 75 connected to the data signal supply line 110 via a first bridge electrode 130 that will be formed later, the third contact hole 161 exposing the second data signal supply line 120, and the fourth contact hole 162 exposing the data line 75 connected to the second data signal supply line via a second bridge electrode 140 that will be formed later, are formed through the passivation layer 80. In this case, the sizes of the first and second contact holes 151 and 152 may be formed to be larger than the sizes of the third and fourth contact holes 161 and 162, and vice versa. It is preferable but not necessary that the sizes A3 and A4 of the third and fourth contact holes 161 and 162 are formed to be larger than the sizes A1 and A2 of the first and second contact holes 151 and 152. Since the specific resistance of the first data signal supply line 110 is smaller than that of the second data signal supply line 120, it is desirable but not necessary that a contact area is reduced in a manner of reducing the size A1 of the first contact hole 151 that exposes the first data signal supply line 110 and the size A2 of the second contact hole 152 that exposes the data line 75 connected to the first data signal supply line 110.

Additionally, separate contact holes to expose areas for the contact pad 250, that is, first ends of the first and second data signal supply lines 110 and 120, are formed.

The passivation layer 80 is formed of the inorganic insulating material, such as $SiN_x$, $SiO_x$ and the like, or an organic insulating material. The passivation layer 80 may include a double-layer structure having an organic passivation layer and an inorganic passivation layer.

Figure 10A:
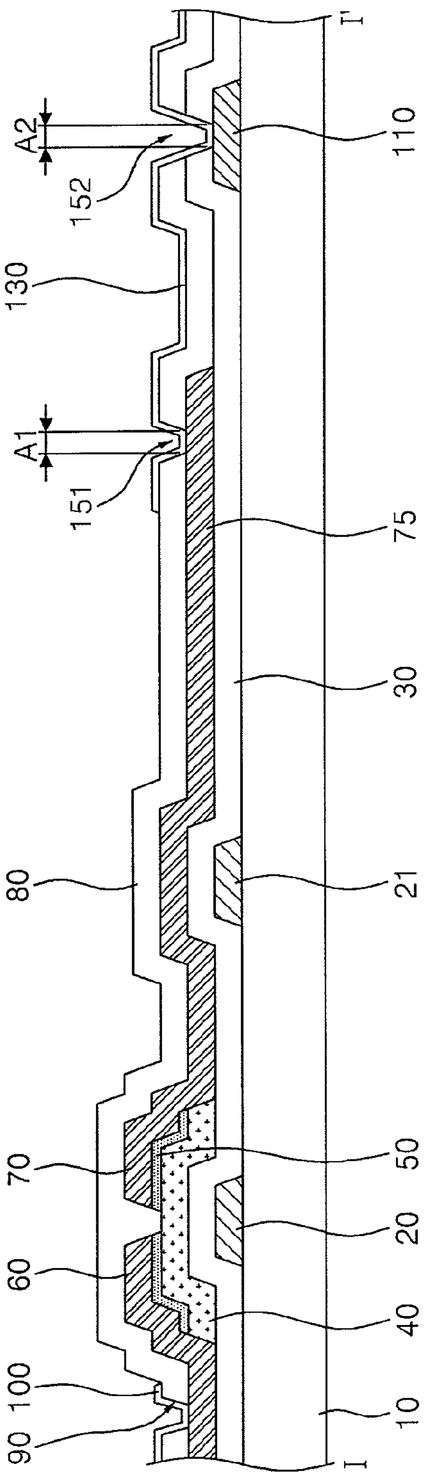
Figure 10B:
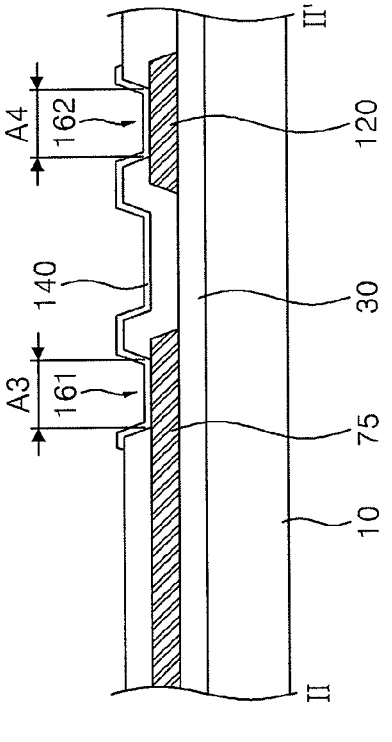

FIGS. 10A and 10B are cross-sectional views showing a fifth mask process of the method according to an exemplary embodiment of the present invention.

The transparent conductive layer including the pixel electrode 100 and the first and second bridge electrodes 130 and 140 is formed on the passivation layer 80 by the fifth mask process.

More specifically, the pixel electrode 10 and the first and second bridge electrodes 130 and 140 are formed in the manner of forming the transparent conductive layer on the passivation layer 80 by sputtering and then patterning the transparent conductive layer by photolithography using a fifth mask and an etching process. In this exemplary embodiment, the transparent conductive layer is formed of transparent conductive material, such as ITO, IZO, TO (tin oxide), and the like. The pixel electrode 100 is connected to the drain electrode 60 via the pixel contact hole 90. The first bridge electrode 130 connects the first data signal supply line 110 and the data line 75 via the first and second contact holes 151 and 152. The second bridge electrode 140 connects the second data signal supply line 120 and the data line 70 via the third and fourth contact holes 161 and 162.

In this exemplary embodiment, using the transparent conductive layer, a contact pad 250 may be formed in each of the contact holes exposing first ends of the first and second data signal supply lines 110 and 120 and connected to the first and second data signal supply lines 110 and 120.

Accordingly, exemplary embodiments of the present invention provide the following effects or advantages.

First of all, the data signal supply line supplying the pixel data signal to the data line is formed with the first and second conductive layers formed of different metals, so that a spaced distance between the data signal supply lines can be decreased, thereby reducing the size of the TFT substrate.

Secondly, if the first and second conductive layers differ from each other in specific resistance, the contact area may be adjusted by controlling the size of the contact hole connected to the bridge electrode. Hence, a display characteristic may be enhanced by varying a voltage drop of the pixel data signal supplied to the data line.

Although exemplary embodiments of the present invention have been described above, it is understood that the present invention should not be limited to these exemplary embodiments and that various changes and modifications can be made by one of ordinary skill in the art within the sprit and scope of the present invention as hereinafter claimed.

What is claimed is:

1. A thin film transistor substrate comprising:

a substrate including a display area and a non-display area located at a periphery of the display area;

a plurality of gate lines on the substrate;

a plurality of data lines crossing the gate lines;

a gate insulating layer disposed between the gate lines and the data lines;

a plurality of thin film transistors each of which is connected to a corresponding gate line of the gate lines and a corresponding data line of the data lines;

a plurality of pixel electrodes disposed in the display area and connected to the thin film transistors, respectively;

a plurality of first data signal supply lines on the substrate in the non-display area;

a plurality of second data signal supply lines on the gate insulating layer, the second data supply lines alternating with the first data signal supply lines;

a plurality of first bridge electrodes, each of which connects through a plurality of contact holes a first data signal supply line of the plurality of first data signal supply lines to a corresponding data line of the data lines; and a plurality of second bridge electrodes, each of which connects through a plurality of contact holes a second data signal supply line of the plurality of second data signal supply lines to a corresponding data line of the data lines, wherein the first and second data signal supply lines are formed in the non-display area located above and below the display area, respectively.

2. The thin film transistor substrate of claim 1, wherein one of the first data signal supply lines formed in the non-display area located in one side of the display is connected to $M^{th}$ data line, one of the second data signal supply lines formed in the non-display area located in one side of the display is connected to $(4M-2)^{th}$ data line, one of the first data signal supply lines formed in the non-display area located in the other side of the display area is connected to $(4M-3)^{th}$ data line, and one of the second data signal supply lines formed in the non-display area located in the other side of the display area is connected to $(4M-1)^{th}$ data line.

3. The thin film transistor substrate of claim 2, first and second contact holes exposing the first data signal supply line and the $4M^{th}$ data line on the non-display areas located above and below the display area, respectively;

the first bridge electrode connecting one of the first data signal supply lines to the $4M^{th}$ data line via the first and second contact holes;

third and fourth contact holes exposing the second data signal supply line and the $(4M-2)^{th}$ data line on the non-display areas located above and below the display area, respectively; and the second bridge electrode connecting one of the second data signal supply lines and the $(4M-2)^{th}$ data line via the third and fourth contact holes.

4. The thin film transistor substrate of claim 3, wherein the first and second contact holes are larger than the third and fourth contact holes, or the third and fourth holes are larger than the first and second contact holes.

5. The thin film transistor substrate of claim 4, wherein the first and second bridge electrodes are formed of a same metal on a same plane as the pixel electrode.

6. A method of fabricating a thin film transistor substrate, comprising:

forming a plurality of gate lines on a substrate, the substrate including a display area and a non-display area located at a periphery of the display area;

forming a plurality of first data signal supply lines in the non-display area;

forming a gate insulating layer on the substrate having the gate lines;

forming a plurality of data lines on the gate insulating layer to cross the gate lines;

forming a plurality of second data signal supply lines on the gate insulating layer in the non-display area, the second data signal supply lines alternating with the first data signal supply lines;

forming a plurality of thin film transistors each of which is connected to a corresponding gate line of the gate lines and a corresponding data line of the data lines;

forming a passivation layer on the thin film transistors;

forming a plurality of pixel electrodes connected to the thin film transistors on the display area, respectively;

forming a plurality of first bridge electrodes in the non-display area, each first bridge electrode connecting a first data signal supply line of the plurality of the first data signal supply lines to a corresponding data line of the data lines; and forming a plurality of second bridge electrodes in the non-display area, each second bridge electrode connecting a second data signal supply line of the plurality of the second data signal supply lines to a corresponding data line of the data lines, wherein a part of the first and second data signal supply lines is parallel to the gate lines and at least one of the parts extends between at least two of the data lines, wherein the gate lines and the first data signal supply lines are formed of a first conductive layer and the data lines and the second data signal supply lines are formed of a second conductive layer, wherein the second data signal supply lines are formed to be parallel with one of the first data signal supply lines, and wherein the first and second data signal supply lines are formed in the non-display areas located above and below the display area, respectively.

7. The method of claim 6, further comprising:

connecting one of the first data signal supply lines formed on the non-display area located above the display area to the $4M^{th}$ data line via one of the first bridge electrode;

connecting one of the first data signal supply lines formed on the non-display area located below the display area to the $(4M-3)^{th}$ data line via one of the first bridge electrode;

connecting one of the second data signal supply lines on the non-display area located above the display area to the $(4M-2)^{th}$ data line via one of the second bridge electrode; and connecting one of the second data signal supply lines on the non-display area located below the display area to the $(4M-1)^{th}$ data line via one of the second bridge electrode.

8. The method of claim 7, wherein the step of forming the first and second data signal supply lines comprises forming a contact pad connected to a driving circuit to be formed at end parts of the first and second data signal supply lines.

* * * * *